(12) United States Patent
Choi

(10) Patent No.: US 12,535,736 B2
(45) Date of Patent: Jan. 27, 2026

(54) ANTI-REFLECTIVE HARD MASK COMPOSITION

(71) Applicant: CHEMPOLE CO., LTD., Hwaseong-si (KR)

(72) Inventor: Sangjun Choi, Suwon-si (KR)

(73) Assignee: CHEMPOLE CO., LTD., Hwaseong-si (KR)

(*) Notice: Subject to any disclaimer, the term of this patent is extended or adjusted under 35 U.S.C. 154(b) by 505 days.

(21) Appl. No.: 18/248,526

(22) PCT Filed: Nov. 18, 2020

(86) PCT No.: PCT/KR2020/016221
§ 371 (c)(1),
(2) Date: Apr. 11, 2023

(87) PCT Pub. No.: WO2022/092394
PCT Pub. Date: May 5, 2022

(65) Prior Publication Data
US 2023/0375929 A1  Nov. 23, 2023

(30) Foreign Application Priority Data
Oct. 28, 2020  (KR) .......................... 10-2020-0140815

(51) Int. Cl.
G03F 7/09 (2006.01)
C08G 61/12 (2006.01)

(52) U.S. Cl.
CPC ........... *G03F 7/091* (2013.01); *C08G 61/124* (2013.01); *C08G 61/125* (2013.01); *C08G 61/126* (2013.01); *C08G 2261/124* (2013.01); *C08G 2261/18* (2013.01); *C08G 2261/228* (2013.01); *C08G 2261/314* (2013.01); *C08G 2261/3142* (2013.01); *C08G 2261/3241* (2013.01); *C08G 2261/3242* (2013.01); *C08G 2261/3243* (2013.01)

(58) Field of Classification Search
CPC ..... G03F 7/091; C08G 61/124; C08G 61/125; C08G 61/126; C08G 2261/124; C08G 2261/18; C08G 2261/228; C08G 2261/314; C08G 2261/3142; C08G 2261/3241; C08G 2261/3242; C08G 2261/3243; C08G 10/00; C08G 61/12; C08K 5/0025; C08L 65/00
USPC ...................... 430/270.1, 271.1, 272.1, 273.1
See application file for complete search history.

(56) References Cited

U.S. PATENT DOCUMENTS

| | | | |
|---|---|---|---|
| 10,340,148 B2 | 7/2019 | Kwon et al. | |
| 10,353,292 B2 | 7/2019 | Nam et al. | |
| 10,886,119 B2 * | 1/2021 | Liu | ........................ C08L 65/00 |
| 2016/0237195 A1 * | 8/2016 | Namgung | ................ G03F 7/094 |
| 2017/0110328 A1 * | 4/2017 | Kwon | ................... C09D 179/04 |
| 2020/0348592 A1 * | 11/2020 | Kaitz | ....................... G03F 7/094 |

FOREIGN PATENT DOCUMENTS

| | | |
|---|---|---|
| KR | 10-2008-0107210 A | 12/2008 |
| KR | 10-2009-0120827 A | 11/2009 |
| KR | 10-2017-0037441 A | 4/2017 |
| KR | 10-2017-0045592 A | 4/2017 |
| KR | 10-2017-0072035 A | 6/2017 |
| KR | 10-2017-0087294 A | 7/2017 |
| KR | 10-2017-0126750 A | 11/2017 |
| KR | 10-1962419 B1 | 3/2019 |
| WO | 2013100365 A1 | 7/2013 |

OTHER PUBLICATIONS

Office Action to the corresponding Korean Patent Application 10-2020-0140815.
Notice of Allowance of the corresponding Korean Patent Application 10-2020-0140815.

* cited by examiner

*Primary Examiner* — Caleen O Sullivan
(74) *Attorney, Agent, or Firm* — You & IP, LLC

(57) ABSTRACT

An anti-reflective hard mask comprises: (a) a terpolymer in the form of a hetero aromatic represented by chemical formula 1, or a terpolymer blend comprising same; and (b) an organic solvent.

[Chemical Formula 1]

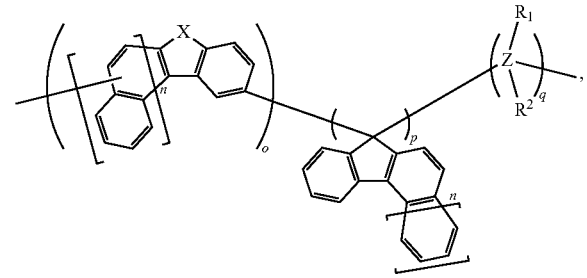

wherein in the above Formula, X represents an oxygen, sulfur, or nitrogen atom, and n is 0 or 1, and Z group, as a monomer of the terpolymer, is a C6 to C40 aryl group and a heteroaryl group capable of forming a copolymer with the heteroaromatic monomer and a fluorenone derivative monomer, includes an ether bond or an amino bond, and R1 and R2 are hydrogen or a hydroxyl group, and are the same as or different from each other.

10 Claims, No Drawings

ANTI-REFLECTIVE HARD MASK COMPOSITION

TECHNICAL FIELD

The present invention relates to a hard mask composition having antireflection film properties useful for a lithographic process and, more particularly, to a heteroaromatic terpolymer having strong absorption in the ultraviolet wavelength region and a hard mask composition including the same.

BACKGROUND ART

As ultra-fine processes are increasingly required in the semiconductor industry, an effective lithographic process is essential to realize such ultra-fine technologies. In particular, the demand for new materials for the hard mask process, which is very essential in the etching process, is increasing.

In general, the hard mask film serves as an intermediate film that transfers a fine pattern of photoresist to a lower substrate layer through a selective etching process. Therefore, the hard mask film requires properties such as chemical resistance, heat resistance, and etching resistance to withstand multiple etching processes. The existing hard mask film has used an amorphous carbon layer (ACL) film made by a chemical vapor deposition (CVD) method, but it has many disadvantages such as high cost of equipment investment, particles generated during the process, and a photo alignment problem due to film opaqueness.

Recently introduced is a spin-on hard mask formed by a spin-on coating method instead of the CVD method. In the spin-on coating method, a hard mask composition is formed using an organic polymer material having solubility in a solvent. At this time, the most important characteristic is that an organic polymer coating film having etching resistance should be formed.

However, two characteristics required for the organic hard mask film, i.e., solubility and etching resistance, are in a conflicting relationship with each other, so a hard mask composition capable of satisfying both characteristics has been required. Materials adopted in the semiconductor lithography process while satisfying the above characteristics of such organic hard mask materials have recently been introduced (Korean Patent Publication No. 10-2009-0120827, Korean Patent Publication No. 10-2008-0107210, and International Patent Publication No. WO 2013100365 A1). They were hard mask materials using a copolymer having an appropriate high molecular weight synthesized by a conventional phenolic resin manufacturing method using hydroxypyrene.

However, as the semiconductor lithography process has recently become ultra-fine more and more, this organic hard mask material has reached a stage where it is difficult to sufficiently perform the mask role due to the lack of etching selectivity in the etching process compared to conventional inorganic hard mask materials. Therefore, the introduction of an organic hard mask material more optimized for the etching process has become urgently needed.

DISCLOSURE

Technical Problem

An object of the present invention is to provide a hard mask polymer having excellent polymer solubility, high etching selectivity, and sufficient resistance to multiple etching, and a composition including the same.

Another object of the present invention is to provide a novel hard mask polymer that can minimize reflectivity between a resist and a back layer and thus can be used to perform a lithographic technique, and a composition including the same.

Technical Solution

A hard mask composition according to the present invention is an anti-reflective hard mask composition including:

(a) a copolymer including a terpolymer represented by Chemical Formula 1 below, or a blend of the copolymer; and (b) an organic solvent.

[Chemical Formula 1]

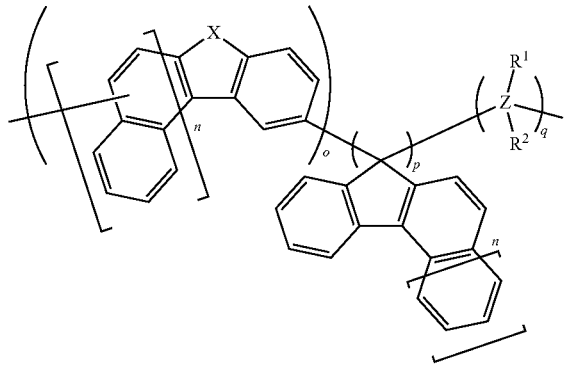

Advantageous Effects

The hard mask composition based on the copolymer including the terpolymer according to the present invention has a very high carbon content in the polymer, which is very advantageous for etch resistance, and at the same time, it has excellent polymer solubility, which is very advantageous for forming a uniform thin film. Therefore, it is possible to provide a lithographic structure having excellent pattern evaluation results because of sufficient resistance to multiple etching by a high etching selectivity compared to conventional organic hard masks.

The hard mask composition based on the heteroaromatic type copolymer according to embodiments of the present invention has a useful range of refractive index and extinction coefficient for an antireflection film in the Deep UV region such as ArF (193 nm) and KrF (248 nm) when forming a film, thereby minimizing reflectivity between the resist and the back layer.

BEST MODE FOR DISCLOSURE

According to the present invention, provided is an anti-reflective hard mask composition including:

(a) a copolymer including a terpolymer represented by Chemical Formula 1 below, or a blend of the copolymer; and (b) an organic solvent.

[Chemical Formula 1]

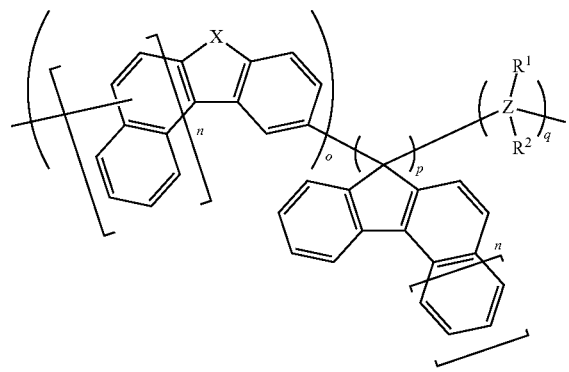

In the above Formula, X represents an oxygen, sulfur, or nitrogen atom, and n is 0 or 1.

Z group, as a monomer constituting a terpolymer, is a C6 to C40 aryl group and a heteroaryl group capable of forming a copolymer with the monomers of heteroaromatic and fluorenone derivatives, and may include an ether bond or an amino bond. In addition, R1 and R2 are hydrogen or a hydroxyl group, and may be the same as or different from each other. Here, each molar ratio of the above monomers has a range as follows: o/(o+p+q)=0.1 to 0.5, p/(o+p+q)=0.4 to 0.6, q/(o+p+q)=0.01 to 0.3.

Meanwhile, the weight-average molecular weight (Mw) of the copolymer including the terpolymer ranges from 1,000 to 50,000, and preferably has a range between 2,000 and 20,000.

The terpolymer having the structure of Chemical Formula 1 may have, for example, the following forms of Chemical Formula 2-1 to Chemical Formula 2-31.

[Chemical Formula 2-1]

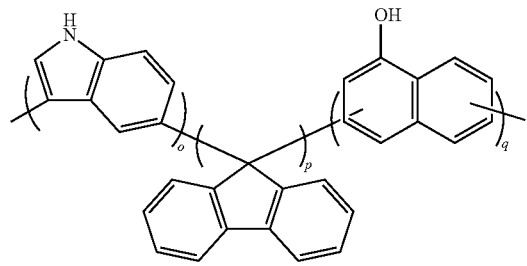

[Chemical Formula 2-2]

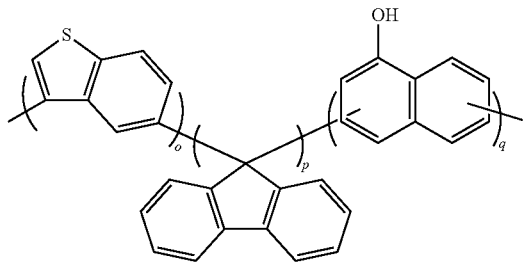

[Chemical Formula 2-3]

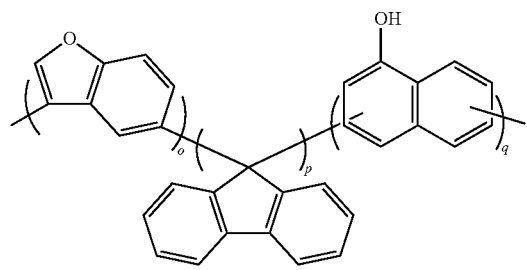

[Chemical Formula 2-4]

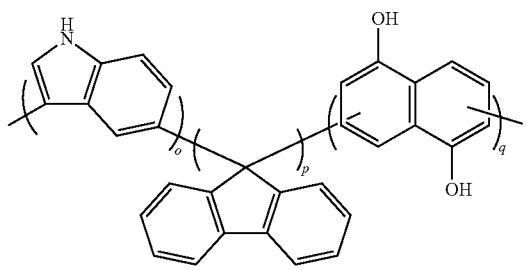

[Chemical Formula 2-5]

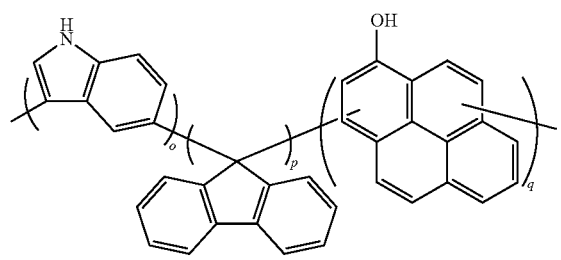

[Chemical Formula 2-6]

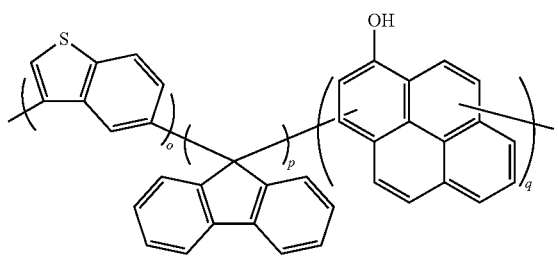

[Chemical Formula 2-7]

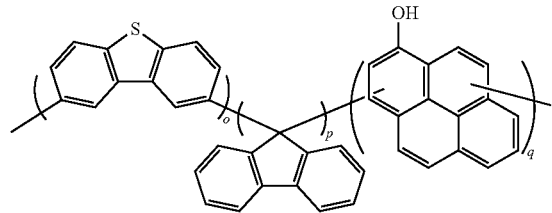

[Chemical Formula 2-8]

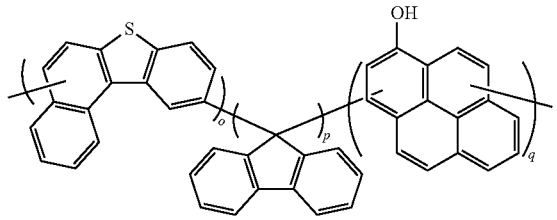

-continued
[Chemical Formula 2-9]
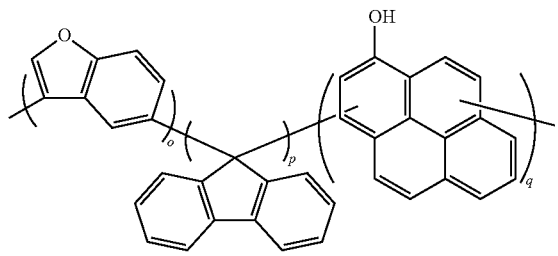
[Chemical Formula 2-10]
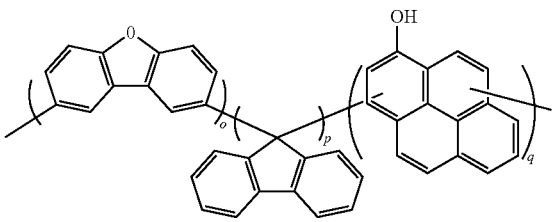
[Chemical Formula 2-11]
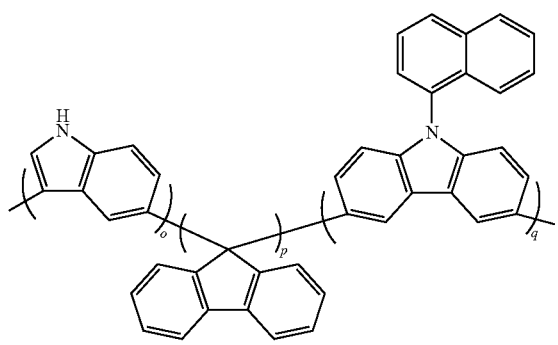
[Chemical Formula 2-12]
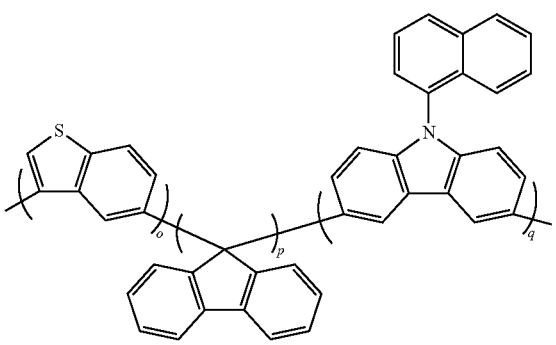
[Chemical Formula 2-13]
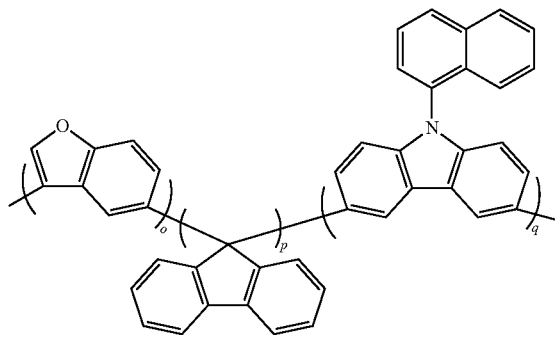
[Chemical Formula 2-14]
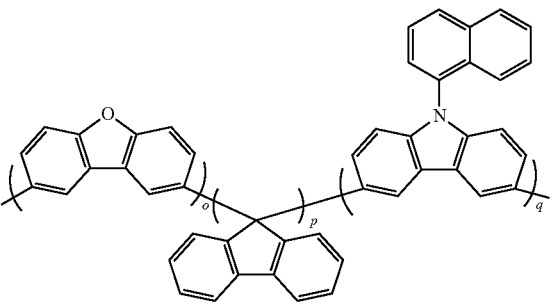
[Chemical Formula 2-15]
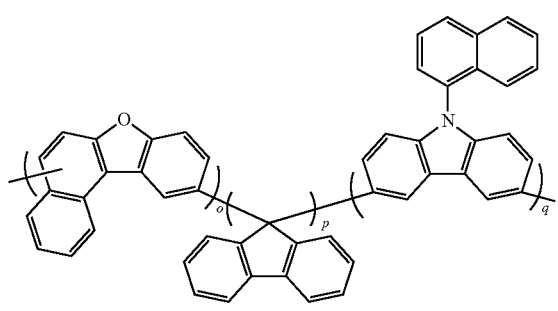
[Chemical Formula 2-16]
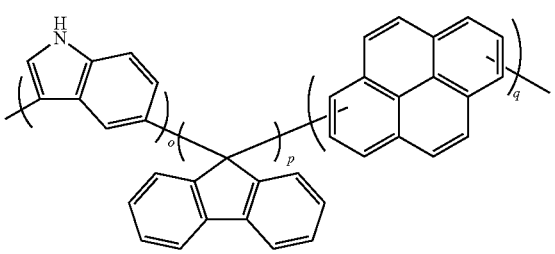
[Chemical Formula 2-17]
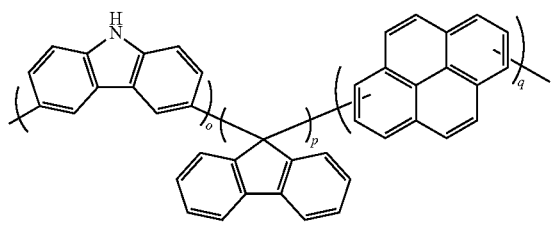
[Chemical Formula 2-18]
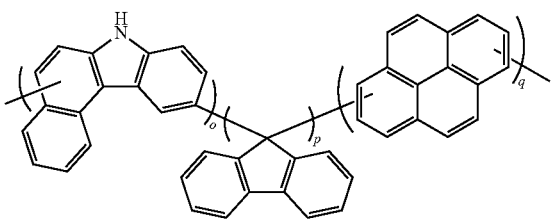

[Chemical Formula 2-19]
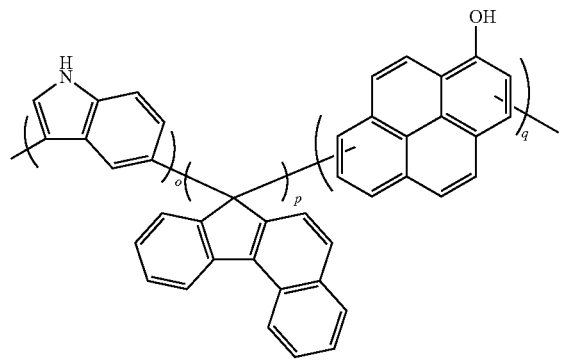
[Chemical Formula 2-20]
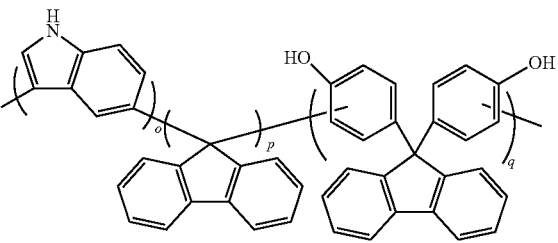
[Chemical Formula 2-21]
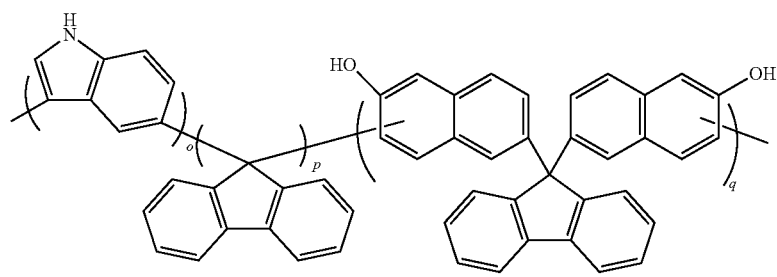
[Chemical Formula 2-22]
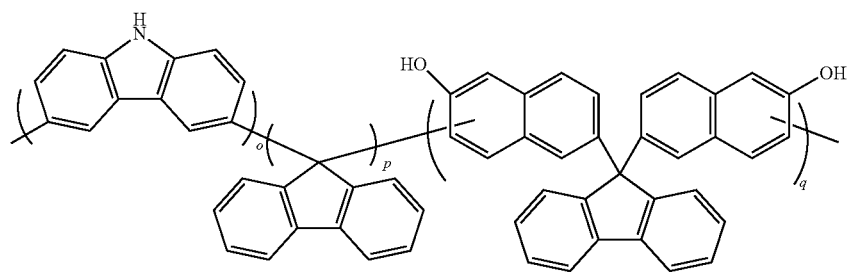
[Chemical Formula 2-23]
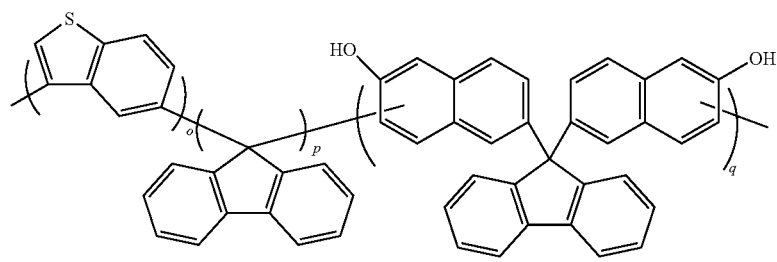
[Chemical Formula 2-24]
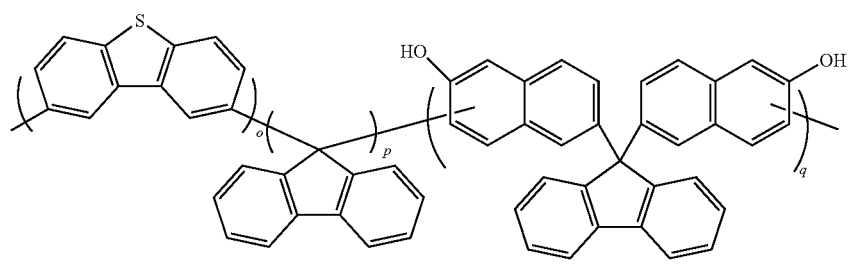

[Chemical Formula 2-25]
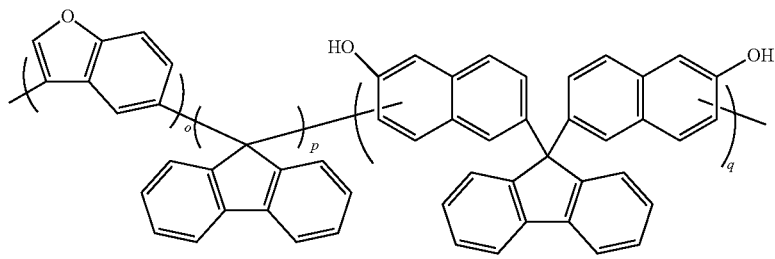
[Chemical Formula 2-26]
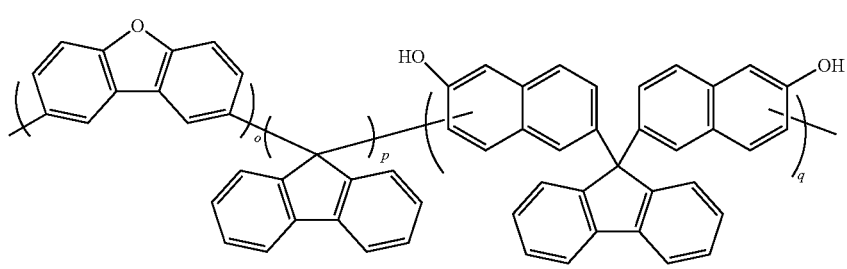
[Chemical Formula 2-27]
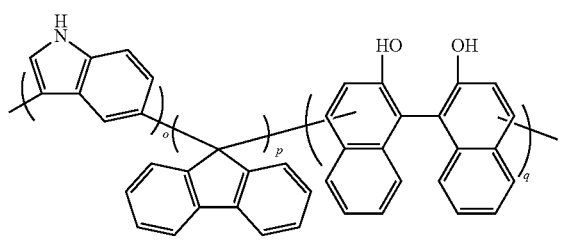
[Chemical Formula 2-28]
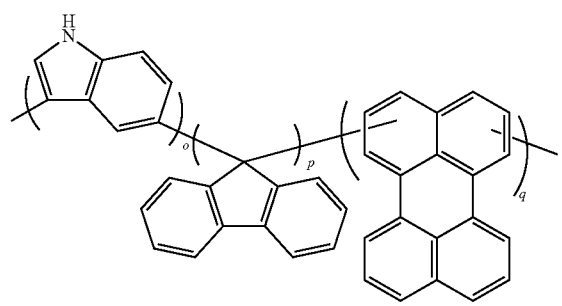
[Chemical Formula 2-29]
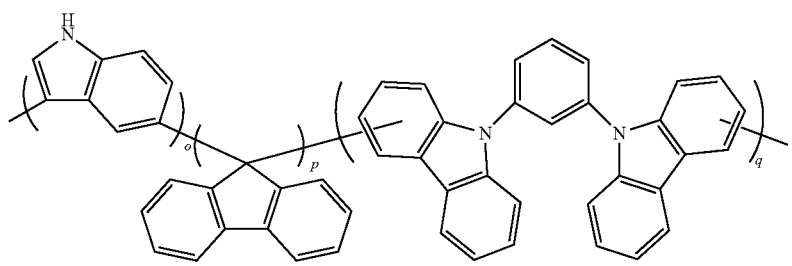
[Chemical Formula 2-30]
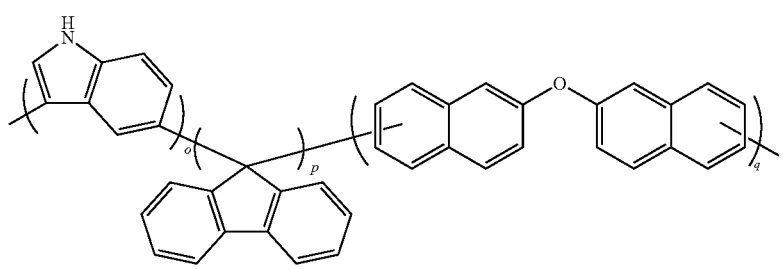

-continued

[Chemical Formula 2-31]

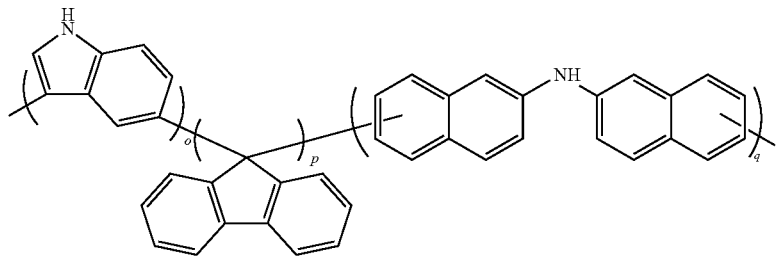

In order to improve the dissolution properties and coating properties or curing properties of the entire hard mask composition, the polymer including the terpolymer, and the blend thereof, may further use novolac resins or aromatic C6 to C20 novolac polymers with a hydroxyl group.

Meanwhile, in order to prepare the hard mask composition, it is desirable to use the copolymer including the terpolymer, or the blend of such copolymers, as mentioned above in (a) in an amount of 1 to 30% by weight with respect to 100 parts by weight of the total composition.

When the above 'copolymer or blend' in (a) is used less than 1 part by weight or more than 30 parts by weight, it becomes less than or exceeds a desired coating thickness, thereby making it difficult to accurately match the coating thickness.

In addition, the organic solvent is used in an amount excluding the amount of other components of the composition out of 100 parts by weight of the total composition. Although the organic solvent may use, for example, propylene glycol monomethyl ether acetate (PGMEA), cyclohexanone, ethyl lactate, gamma butyrolactone, or the like, it is not particularly limited as long as it has sufficient solubility for the aromatic ring-containing polymer.

In addition, the anti-reflective hard mask composition of the present invention may further include (c) a crosslinking agent component and (d) an acid catalyst.

The crosslinking agent component (c) used in the hard mask composition of the present invention is preferably capable of crosslinking the repeating units of the polymer through heating in the catalytic reaction by the generated acid, and the acid catalyst (d) is preferably a thermally activated acid catalyst.

The crosslinking agent component (c) used in the hard mask composition of the present invention is not particularly limited as long as it can react with the aromatic ring-containing polymer of the present invention in a manner that can be catalyzed by the generated acid.

The crosslinking agent may include melamine-based, substituted urea-based, or polymer-based materials thereof. Preferably, the crosslinking agent has at least two crosslinking substituents, and is a compound such as methoxymethylated glycoluril, butoxymethylglycoluril, methoxymethylated melamine, butoxymethylated melamine, methoxymethylated benzoguanamine, butoxymethylated benzoguanamine, methoxymethylation urea, butoxymethylation urea, or methoxymethylation thiourea.

Also, as the crosslinking agent, a crosslinking agent having high heat resistance can be used, and a compound containing a crosslinking substituent having an aromatic ring in the molecule can be preferably used. Such compounds may have, for example, the form such as the following structural formula.

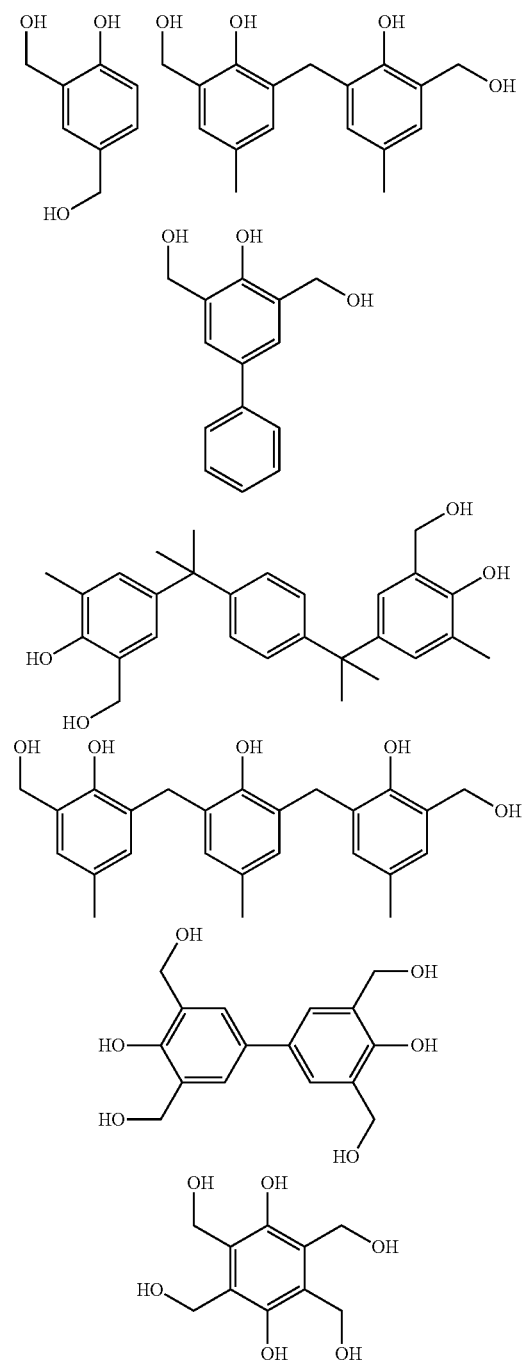

-continued

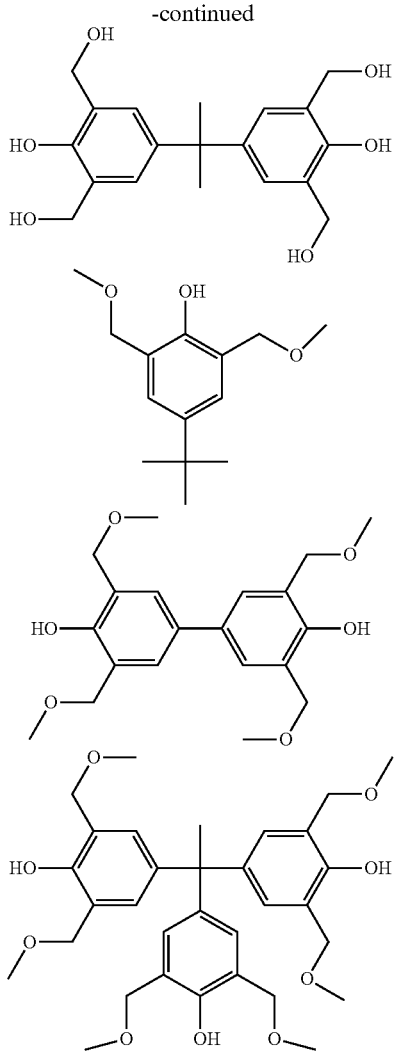

As the acid catalyst (d) used in the hard mask composition of the present invention, an organic acid such as p-toluene-sulfonic acid monohydrate may be used, and a TAG (Thermal Acid Generator) compound that promotes storage stability can also be used as a catalyst.

The TAG preferably uses, for example, pyridinium P-toluene sulfonate, 2,4,4,6-tetrabromocyclohexadienone, benzoin tosylate, 2-nitrobenzyl tosylate, alkyl esters of organic sulfonic acid, or the like an acid generator compound designed to release acid upon heat treatment.

When the hard mask composition is finally formed by further including (c) the crosslinking agent component and (d) the acid catalyst, the hard mask composition of the present invention may be formed of a total of 100% by weight using (a) 1 to 30% by weight, preferably 5 to 20% by weight, of the copolymer including the heteroaromatic terpolymer having strong absorption characteristics in the ultraviolet region, or the blend of the copolymer, (c) 0.1 to 5% by weight, preferably 0.1 to 3% by weight, of the crosslinking agent component, (d) 0.001 to 0.05% by weight, preferably 0.001 to 0.03% by weight, of the acid catalyst component, and (b) the organic solvent as the remaining component. A preferred amount of the organic solvent is 75 to 98% by weight based on 100 parts by weight of the total composition.

If the copolymer including the heteroaromatic terpolymer, or the blend of the copolymer, is less than 1% by weight or more than 30% by weight, it becomes less than or exceeds a desired coating thickness, thereby making it difficult to accurately match the coating thickness.

If the crosslinking agent component is less than 0.1% by weight, crosslinking properties may not appear, and if it exceeds 5% by weight, the optical properties of the coating film may be changed due to excessive input.

In addition, if the acid catalyst is less than 0.001% by weight, crosslinking properties may not well appear, and if it exceeds 0.05% by weight, storage stability may be affected by an increase in acidity due to excessive input.

Mode for Disclosure

Hereinafter, the present invention will be described in more detail through embodiments, but the following embodiments are only for the purpose of explanation and are not intended to limit the scope of the present invention.

Embodiment 1) Synthesis of Copolymer (Chemical Formula 2-1)

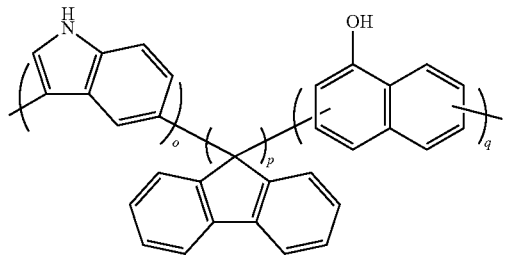

Indole (80 mmol), 9-fluorenone (110 mmol), and 1-naphthol (20 mmol) were completely dissolved in a solvent γ-Butyrolactone (GBL) (three times the total monomer weight) in a 250 mL round flask, 5 mol % of sulfuric acid was added, followed by polymerization at 125° C. for 20 hours.

After polymerization, reactants were precipitated in an excess of methanol/water (8:2) solvent and then neutralized with triethylamine. The resulting precipitate was filtered, washed twice with an excess of methanol solution, then filtered, and dried in a vacuum oven at 80° C. for 24 hours to obtain the polymer of Chemical Formula 2-1.

At this time, the synthesized polymer obtained a weight-average molecular weight (Mw) of 5,400 and a polydispersity (Mw/Mn) of 1.85.

Embodiment 2) Synthesis of Copolymer (Chemical Formula 2-2)

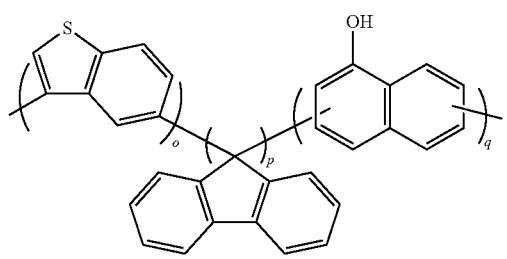

Benzothiophene (80 mmol), fluorenone (110 mmol), and 1-naphthol (20 mmol) were synthesized in the same manner as in the embodiment 1 to obtain the polymer of Chemical Formula 2-2. At this time, the synthesized polymer obtained a weight-average molecular weight (Mw) of 4,800 and a polydispersity (Mw/Mn) of 1.84.

Embodiment 3) Synthesis of Copolymer (Chemical Formula 2-3)

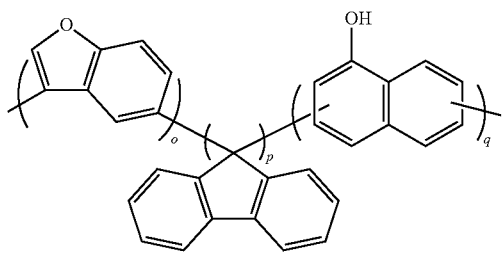

2,3-benzofuran (80 mmol), fluorenone (110 mmol), and 1-naphthol (20 mmol) were synthesized in the same manner as in the embodiment 1 to obtain the polymer of Chemical Formula 2-3. At this time, the synthesized polymer obtained a weight-average molecular weight (Mw) of 4,300 and a polydispersity (Mw/Mn) of 1.89.

Embodiment 4) Synthesis of Copolymer (Chemical Formula 2-4)

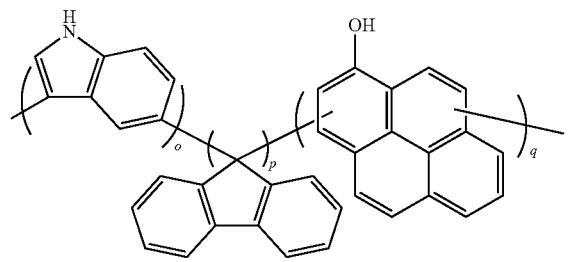

Indole (70 mmol), fluorenone (55 mmol), and 1-pyrenol (30 mmol) were synthesized in the same manner as in the embodiment 1 to obtain the polymer of Chemical Formula 2-5. At this time, the synthesized polymer obtained a weight-average molecular weight (Mw) of 5,900 and a polydispersity (Mw/Mn) of 1.87.

Embodiment 5) Synthesis of Copolymer (Chemical Formula 2-5)

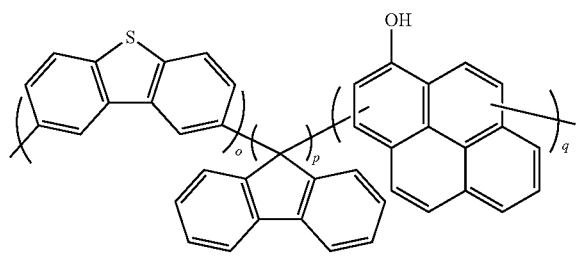

Dibenzothiophene (70 mmol), fluorenone (55 mmol), and 1-pyrenol (30 mmol) were synthesized in the same manner as in the embodiment 1 to obtain the polymer of Chemical Formula 2-7. At this time, the synthesized polymer obtained a weight-average molecular weight (Mw) of 4,700 and a polydispersity (Mw/Mn) of 1.88.

Embodiment 6) Synthesis of Copolymer (Chemical Formula 2-9)

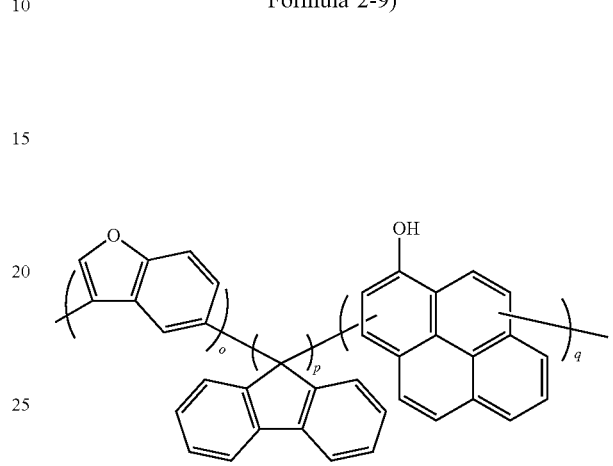

2,3-benzofuran (50 mmol), fluorenone (110 mmol), and 1-pyrenol (50 mmol) were synthesized in the same manner as in the embodiment 1 to obtain the polymer of Chemical Formula 2-9. At this time, the synthesized polymer obtained a weight-average molecular weight (Mw) of 4,500 and a polydispersity (Mw/Mn) of 1.87.

Embodiment 7) Synthesis of Copolymer (Chemical Formula 2-11)

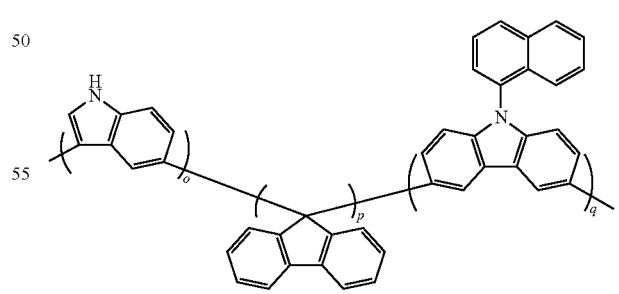

Indole (80 mmol), fluorenone (110 mmol), and 9-naphthylcarbazole (20 mmol) were synthesized in the same manner as in the embodiment 1 to obtain the polymer of Chemical Formula 2-11. At this time, the synthesized polymer obtained a weight-average molecular weight (Mw) of 4,300 and a polydispersity (Mw/Mn) of 1.86.

Embodiment 8) Synthesis of Copolymer (Chemical Formula 2-14)

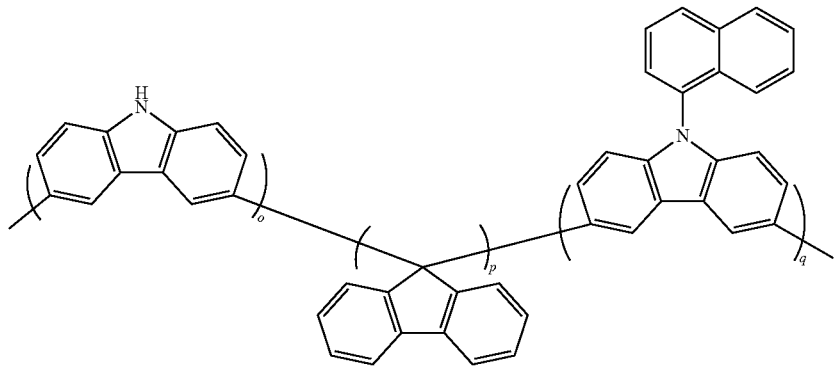

Dibenzofuran (70 mmol), fluorenone (110 mmol), and 9-naphthylcarbazole (30 mmol) were synthesized in the same manner as in the embodiment 1 to obtain the polymer of Chemical Formula 2-14. At this time, the synthesized polymer obtained a weight-average molecular weight (Mw) of 4,100 and a polydispersity (Mw/Mn) of 1.87.

Embodiment 9) Synthesis of Copolymer (Chemical Formula 2-16)

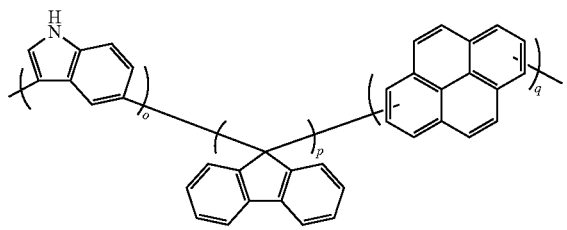

Indole (80 mmol), fluorenone (110 mmol), and pyrene (20 mmol) were synthesized in the same manner as in the embodiment 1 to obtain the polymer of Chemical Formula 2-16. At this time, the synthesized polymer obtained a weight-average molecular weight (Mw) of 6,900 and a polydispersity (Mw/Mn) of 1.88.

Embodiment 10) Synthesis of Copolymer (Chemical Formula 2-18)

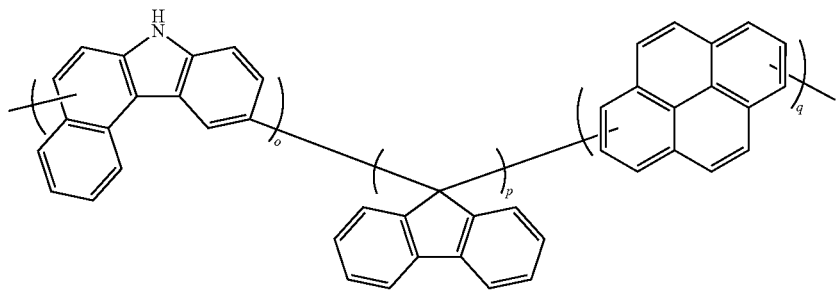

7-benzocarbazole (30 mmol), fluorenone (55 mmol), and pyrene (20 mmol) were synthesized in the same manner as in the embodiment 1 to obtain the polymer of Chemical Formula 2-18. At this time, the synthesized polymer obtained a weight-average molecular weight (Mw) of 2,900 and a polydispersity (Mw/Mn) of 1.88.

Embodiment 11) Synthesis of Copolymer (Chemical Formula 2-19)

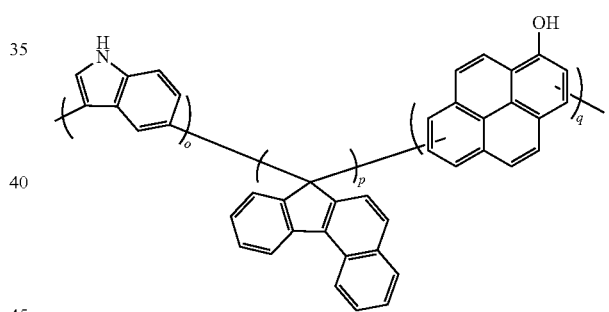

Indole (30 mmol), 7-benzoflurenone (55 mmol), and 1-pyrenol (20 mmol) were synthesized in the same manner as in the embodiment 1 to obtain the polymer of Chemical Formula 2-19. At this time, the synthesized polymer obtained a weight-average molecular weight (Mw) of 3,100 and a polydispersity (Mw/Mn) of 1.88.

Embodiment 12) Synthesis of Copolymer (Chemical Formula 2-20)

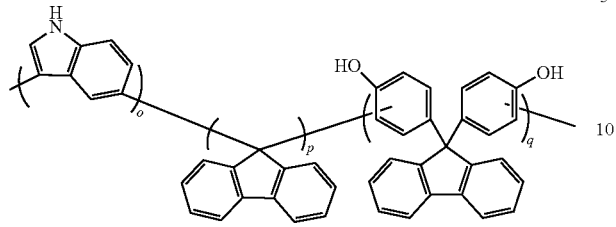

Indole (70 mmol), fluorenone (110 mmol), and 9,9-bishydroxyphenylfluorene (30 mmol) were synthesized in the same manner as in the embodiment 1 to obtain the polymer of Chemical Formula 2-20. At this time, the synthesized polymer obtained a weight-average molecular weight (Mw) of 5,100 and a polydispersity (Mw/Mn) of 1.88.

Embodiment 13) Synthesis of Copolymer (Chemical Formula 2-21)

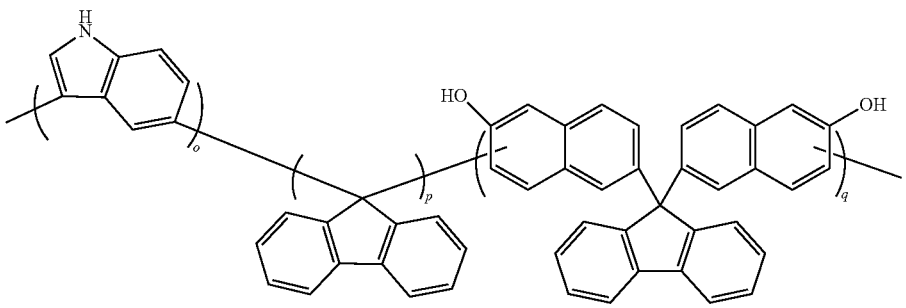

Indole (80 mmol), fluorenone (110 mmol), and 9,9-bishydroxynaphthylfluorene (20 mmol) were synthesized in the same manner as in the embodiment 1 to obtain the polymer of Chemical Formula 2-21. At this time, the synthesized polymer obtained a weight-average molecular weight (Mw) of 5,500 and a polydispersity (Mw/Mn) of 1.89.

Embodiment 14) Synthesis of Copolymer (Chemical Formula 2-24)

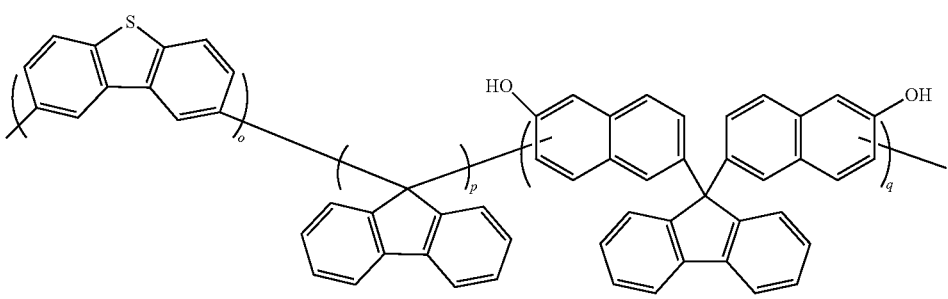

Dibenzothiophene (80 mmol), fluorenone (110 mmol), and 9,9-bishydroxynaphthylfluorene (20 mmol) were synthesized in the same manner as in the embodiment 1 to obtain the polymer of Chemical Formula 2-24. At this time, the synthesized polymer obtained a weight-average molecular weight (Mw) of 5,100 and a polydispersity (Mw/Mn) of 1.88.

Embodiment 15) Synthesis of Copolymer
(Chemical Formula 2-27)

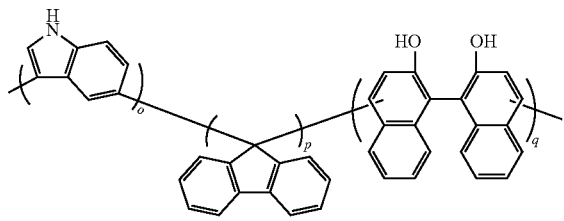

Indole (80 mmol), fluorenone (110 mmol), and 1,1'-bi-2-naphthol (20 mmol) were synthesized in the same manner as in the embodiment 1 to obtain the polymer of Chemical Formula 2-27. At this time, the synthesized polymer obtained a weight-average molecular weight (Mw) of 4,600 and a polydispersity (Mw/Mn) of 1.88.

Embodiment 16) Synthesis of Copolymer
(Chemical Formula 2-28)

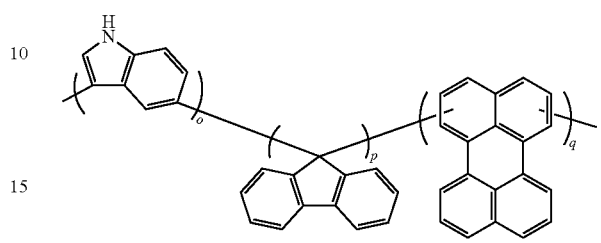

Indole (40 mmol), fluorenone (55 mmol), and perylene (10 mmol) were synthesized in the same manner as in the embodiment 1 to obtain the polymer of Chemical Formula 2-28. At this time, the synthesized polymer obtained a weight-average molecular weight (Mw) of 4,200 and a polydispersity (Mw/Mn) of 1.89.

Embodiment 17) Synthesis of Copolymer
(Chemical Formula 2-30)

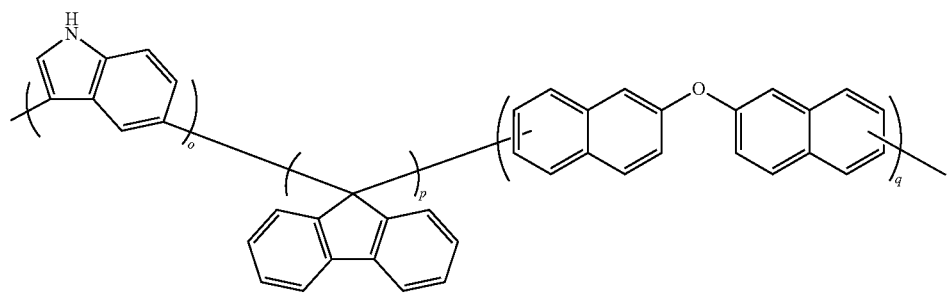

Indole (40 mmol), fluorenone (55 mmol), and 2,2'-dinaphthyl ether (10 mmol) were synthesized in the same manner as in the embodiment 1 to obtain the polymer of Chemical Formula 2-30. At this time, the synthesized polymer obtained a weight-average molecular weight (Mw) of 3,900 and a polydispersity (Mw/Mn) of 1.88.

Embodiment 18) Synthesis of Copolymer
(Chemical Formula 2-31)

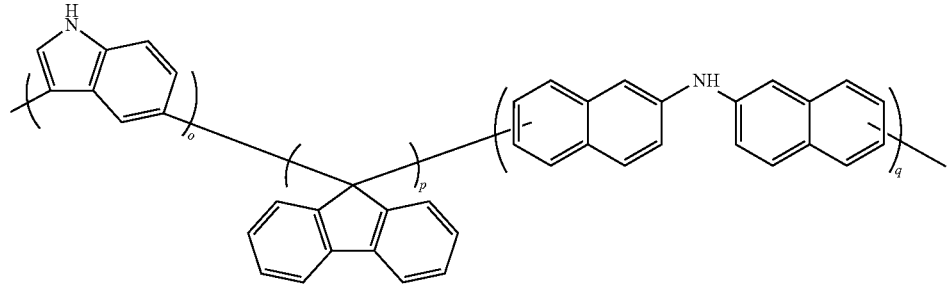

Indole (40 mmol), fluorenone (55 mmol), and 2,2'-dinaphthylamine (10 mmol) were synthesized in the same manner as in the embodiment 1 to obtain the polymer of Chemical Formula 2-31. At this time, the synthesized polymer obtained a weight-average molecular weight (Mw) of 4,700 and a polydispersity (Mw/Mn) of 1.88.

Comparative Example) Synthesis of Phenolic Copolymer

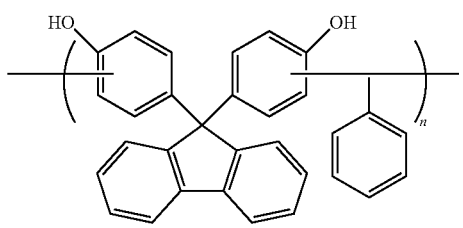

9,9-bishydroxyphenylfluorene (100 mmol) and benzaldehyde (110 mmol) were dissolved in PGMEA, and 5 mol % concentrated sulfuric acid was added thereto.

After polymerization in the same manner as in the embodiment 1, the polymer was purified and dried in a vacuum oven to obtain a polymer having a weight-average molecular weight (Mw) of 3,300.

Preparation of Hard Mask Composition 1 g of the polymer prepared in each of the embodiments 1 to 18 and the comparative example and 300 ppm of surfactant (compared to the weight of the polymer) were completely dissolved in 7 g of propylene glycol monomethyl ether acetate and 3 g of cyclohexanone, and then filtered using a 0.1 um membrane filter to make sample solutions of the embodiments 1 to 18 and the comparative example.

Each of the sample solutions prepared in the embodiments 1 to 18 and the comparative example was spin-coated on a silicon wafer and baked at 400° C. for 120 seconds to form a film having a thickness of 3000 Å.

At this time, the refractive index n and extinction coefficient k of the formed films were respectively obtained. The equipment used is an Ellipsometer (J. A. Woollam), and the measurement results are shown in Table 1.

As a result of the evaluation, it was confirmed that there were a refractive index and an extinction coefficient usable as an antireflection film at ArF (193 nm) and KrF (248 nm) wavelengths. In general, the refractive index range of a material used as a semiconductor antireflection film is about 1.4 to 1.8. In addition, the higher the extinction coefficient, the better, but there is usually no problem in using it as an antireflection film if the k value is 0.3 or more. Therefore, it can be seen that the hard mask composition according to the embodiments of the present invention can be used as an antireflection film.

TABLE 1

| Sample Type | Optical Properties (193 nm) | | Optical Properties (248 nm) | |
| --- | --- | --- | --- | --- |
| | Refractive Index (n) | Extinction Coefficient (k) | Refractive Index (n) | Extinction Coefficient (k) |
| Embodiment 1 | 1.51 | 0.58 | 1.71 | 0.54 |
| Embodiment 2 | 1.53 | 0.61 | 1.73 | 0.55 |

TABLE 1-continued

| Sample Type | Optical Properties (193 nm) | | Optical Properties (248 nm) | |
| --- | --- | --- | --- | --- |
| | Refractive Index (n) | Extinction Coefficient (k) | Refractive Index (n) | Extinction Coefficient (k) |
| Embodiment 3 | 1.51 | 0.60 | 1.72 | 0.55 |
| Embodiment 4 | 1.55 | 0.63 | 1.73 | 0.58 |
| Embodiment 5 | 1.55 | 0.68 | 1.74 | 0.61 |
| Embodiment 6 | 1.54 | 0.61 | 1.72 | 0.54 |
| Embodiment 7 | 1.56 | 0.61 | 1.72 | 0.54 |
| Embodiment 8 | 1.55 | 0.60 | 1.71 | 0.55 |
| Embodiment 9 | 1.54 | 0.63 | 1.72 | 0.54 |
| Embodiment 10 | 1.52 | 0.61 | 1.70 | 0.56 |
| Embodiment 11 | 1.53 | 0.64 | 1.72 | 0.56 |
| Embodiment 12 | 1.54 | 0.65 | 1.71 | 0.53 |
| Embodiment 13 | 1.55 | 0.66 | 1.74 | 0.57 |
| Embodiment 14 | 1.53 | 0.63 | 1.72 | 0.56 |
| Embodiment 15 | 1.56 | 0.61 | 1.72 | 0.53 |
| Embodiment 16 | 1.54 | 0.65 | 1.76 | 0.55 |
| Embodiment 17 | 1.55 | 0.62 | 1.75 | 0.52 |
| Embodiment 18 | 1.54 | 0.61 | 1.72 | 0.53 |
| Comparative Example | 1.48 | 0.51 | 1.95 | 0.35 |

Lithographic Evaluation of Anti-Reflective Hard Mask Composition

Each of the sample solutions prepared in the embodiments 1, 4, 7, and 9 and the comparative example was spin-coated on an aluminum-coated silicon wafer and baked at 240° C. for 60 seconds to form a coating film having a thickness of 3000 Å.

Each of the formed coating films was coated with KrF photoresist, baked at 110° C. for 60 seconds, exposed using the exposure equipment of ASML (XT: 1400, NA 0.93), and then developed with TMAH (tetramethyl ammonium hydroxide) 2.38 wt % aqueous solution for 60 seconds. Then, as a result of examining each 90 nm line and space pattern using V-SEM, the results were obtained as shown in Table 2. The EL (expose latitude) margin according to a change in the exposure amount and the DoF (depth of focus) margin according to a change in the distance from the light source were considered and recorded in Table 2. As a result of the pattern evaluation, good results were confirmed in terms of profile or margin, and it was found that the EL margin and DoF margin required in the lithographic pattern evaluation were satisfied.

TABLE 2

| Sample Type | Pattern Characteristics | | |
| --- | --- | --- | --- |
| | EL Margin (Δ mJ/energy mJ) | DoF Margin (μm) | Pattern Shape |
| Embodiment 1 | 0.3 | 0.3 | Cubic |
| Embodiment 4 | 0.4 | 0.3 | Cubic |
| Embodiment 7 | 0.4 | 0.4 | Cubic |
| Embodiment 9 | 0.4 | 0.4 | Cubic |
| Comparative Example | 0.2 | 0.2 | Undercut |

Etching Characteristics Evaluation of Anti-Reflective Hard Mask Composition

The hard mask compositions (10% by weight) according to the embodiments 1 to 18 and the comparative example were heat-treated at 400° C. for 120 seconds to form thin films. After dry etching for 60 seconds using N2/O2 mixed gas (conditions of 50 mT/300 W/10 O2/50 N2) and CFx gas (conditions of 100 mT/600 W/42 CF4/600 Ar/15 O2), the thickness of the thin film was measured before and after etching. Each etch rate (Å/s) was calculated by dividing the thickness change of the thin film by the etching time. The results are shown in Table 3 below.

TABLE 3

| Sample | N2/O2 etch (Å/s) | CFx etch (Å/s) |
| --- | --- | --- |
| Embodiment 1 | 34.5 | 26.7 |
| Embodiment 4 | 34.1 | 23.3 |
| Embodiment 5 | 34.6 | 23.4 |
| Embodiment 7 | 34.7 | 23.0 |
| Embodiment 9 | 32.5 | 22.5 |
| Embodiment 12 | 34.2 | 25.1 |
| Embodiment 13 | 34.8 | 24.3 |
| Embodiment 15 | 32.8 | 25.7 |
| Embodiment 18 | 34.5 | 24.5 |
| Comparative Example | 36.2 | 35.5 |

As shown in Table 3, the thin films formed in the above embodiments show very excellent etching resistance compared to the thin film formed in the comparative example. Based on such bulk etch characteristics, it is expected that the hard mask composition prepared in the above embodiments can serve as an excellent anti-reflective hard mask for lithography pattern formation.

Although embodiments of the present invention are described above, these embodiments are exemplary only and not construed as a limitation. Various changes and modifications to the present invention and their equivalents can be made as well understood by those skilled in the art without departing from the technical subject matter of the present invention and the scope of appended claims.

INDUSTRIAL APPLICABILITY

The anti-reflective hard mask composition of the present invention exhibits antireflection film properties useful for lithographic processes and thus can be widely used in the semiconductor device manufacturing industry requiring ultra-fine processes.

The invention claimed is:

1. A terpolymer represented by Chemical Formula 1 below and containing a monomer of a heteroaromatic structure,

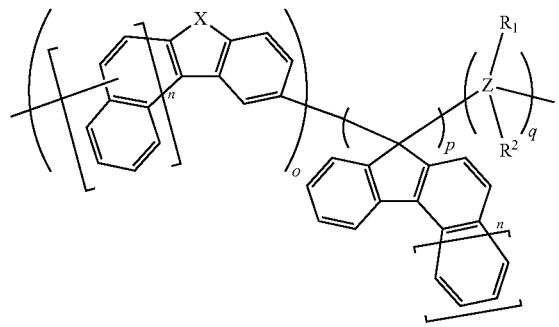

wherein in the above Formula, X represents an oxygen, sulfur, or nitrogen atom, and n is 0 or 1, and wherein Z group, as a monomer of the terpolymer, is a C6 to C40 aryl group and a heteroaryl group capable of forming a copolymer with the heteroaromatic monomer and a fluorenone derivative monomer, includes an ether bond or an amino bond, and R1 and R2 are hydrogen or a hydroxyl group, and are the same as or different from each other, where each molar ratio of the monomers of the terpolymer has a range as follows: o/(o+p+q)=0.1 to 0.5, p/(o+p+q)=0.4 to 0.6, q/(o+p+q)=0.01 to 0.3.

2. The terpolymer of claim 1, wherein X is nitrogen (N), and n is 0 or 1, and wherein the Z group has a naphthalene, pyrene, perylene, fluorene, carbazole, or bicarbazole derivative structure.

3. The terpolymer of claim 1, wherein X is sulfur(S), and n is 0 or 1, and wherein the Z group has a naphthalene, pyrene, perylene, fluorene, carbazole, or bicarbazole derivative structure.

4. The terpolymer of claim 1, wherein X is oxygen (O), and n is 0 or 1, and wherein the Z group has a naphthalene, pyrene, perylene, fluorene, carbazole, or bicarbazole derivative structure.

5. The terpolymer of claim 1, wherein the terpolymer containing the heteroaromatic structure is any one of Chemical Formulas 2-1 to 2-31 below:

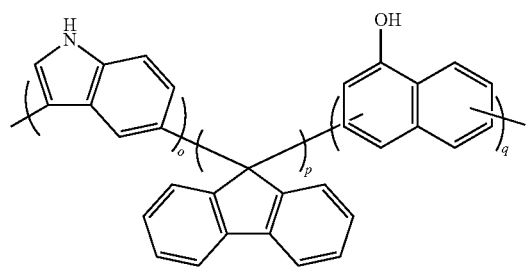

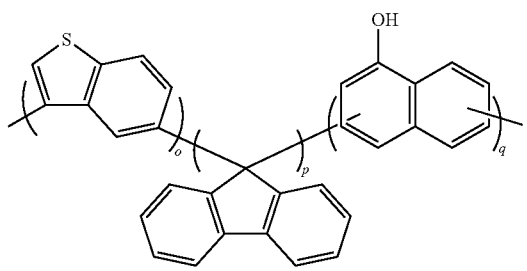

-continued
[Chemical Formula 2-3]
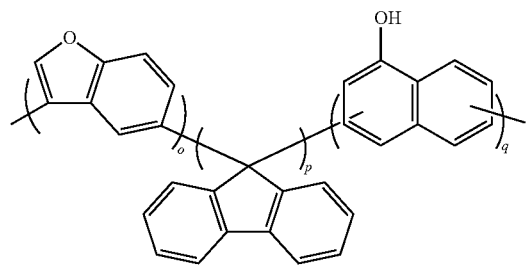
[Chemical Formula 2-4]
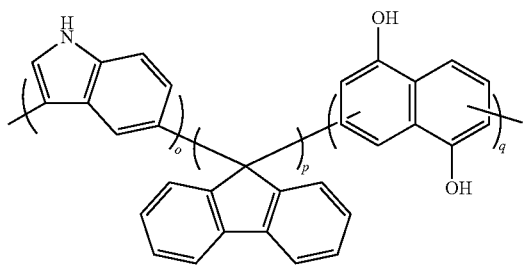
[Chemical Formula 2-5]
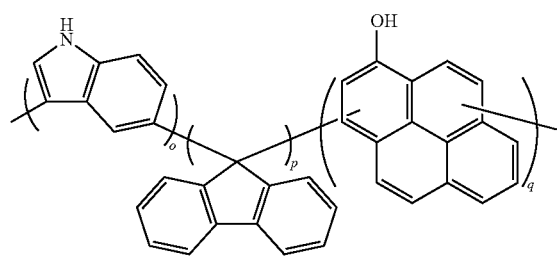
[Chemical Formula 2-6]
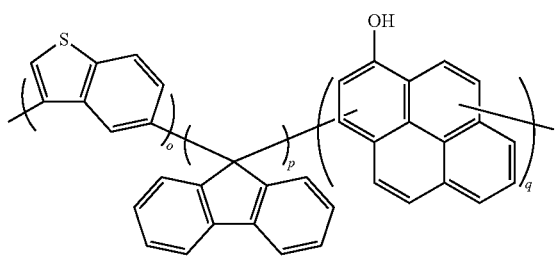
[Chemical Formula 2-7]
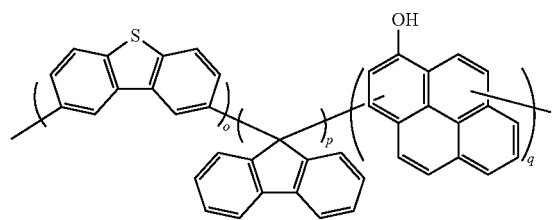
[Chemical Formula 2-8]
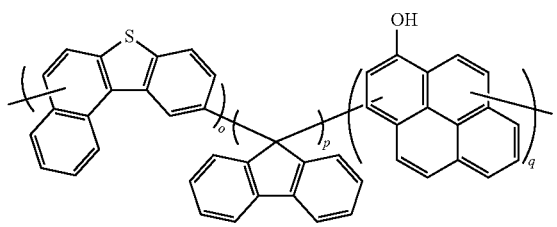
[Chemical Formula 2-9]
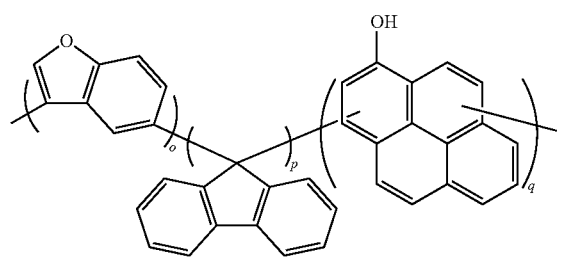
[Chemical Formula 2-10]
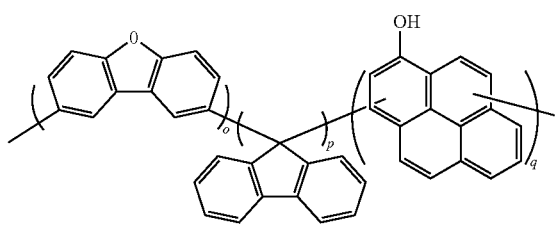
[Chemical Formula 2-11]
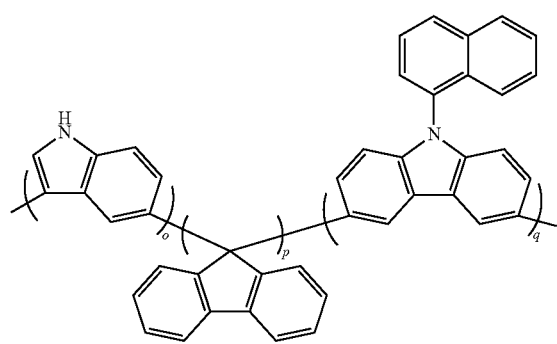
[Chemical Formula 2-12]
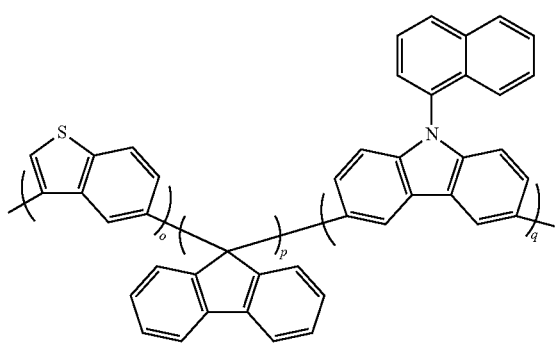

-continued
[Chemical Formula 2-13]
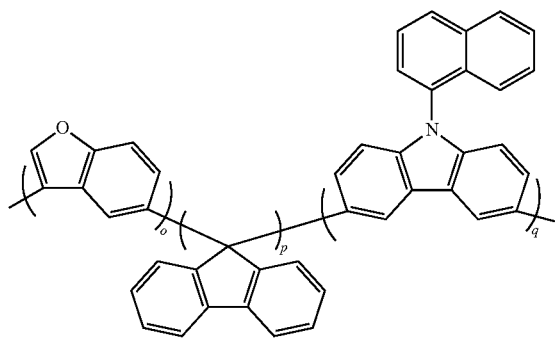
[Chemical Formula 2-14]
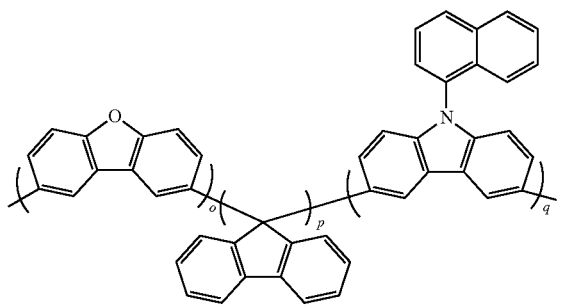
[Chemical Formula 2-15]
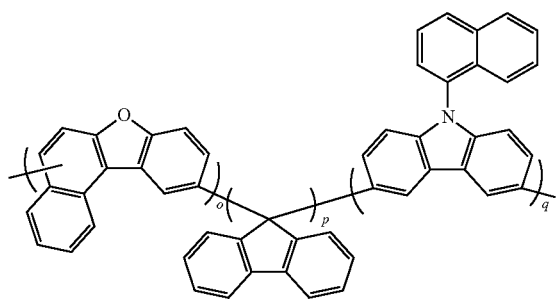
[Chemical Formula 2-16]
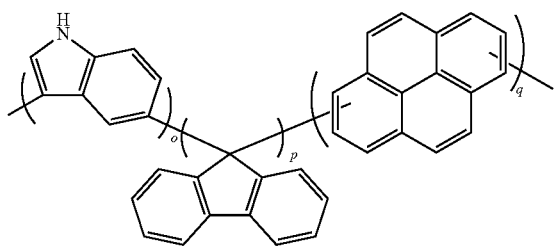
[Chemical Formula 2-17]
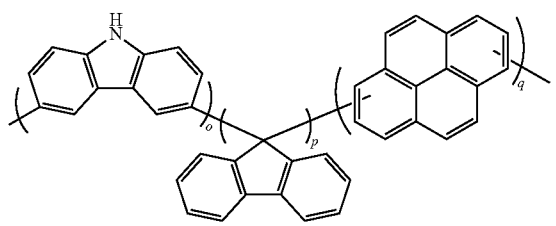
[Chemical Formula 2-18]
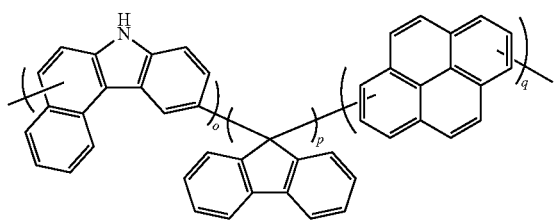
[Chemical Formula 2-19]
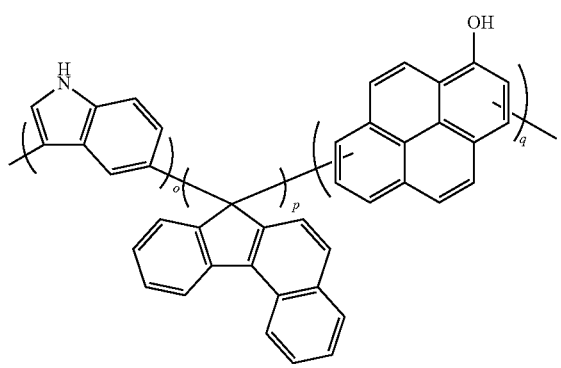
[Chemical Formula 2-20]
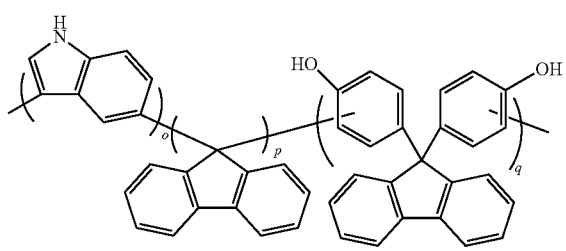
[Chemical Formula 2-21]
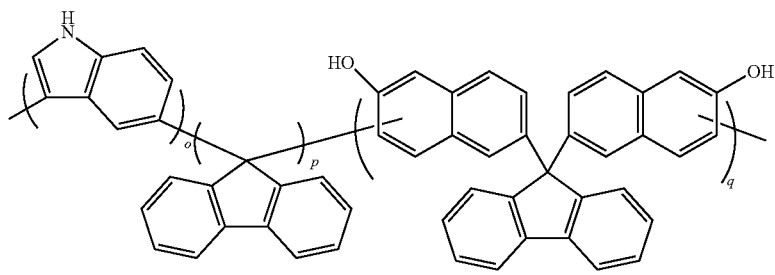

[Chemical Formula 2-22]
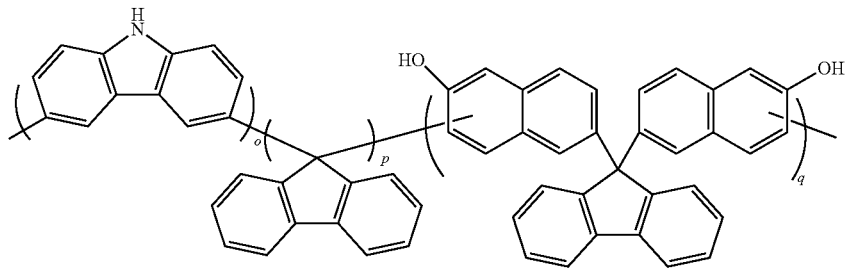
[Chemical Formula 2-23]
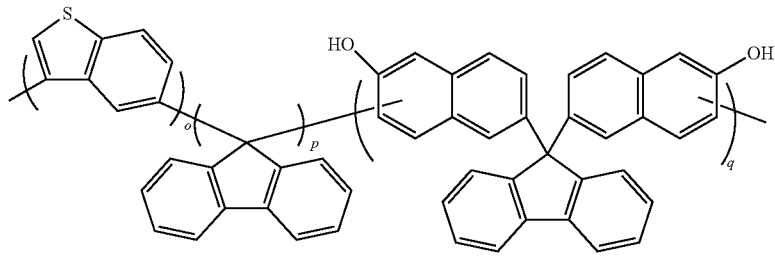
[Chemical Formula 2-24]
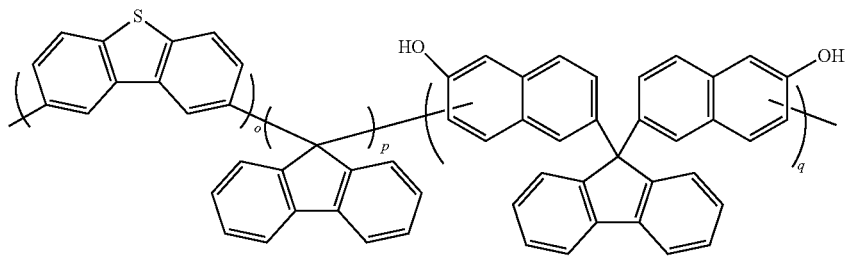
[Chemical Formula 2-25]
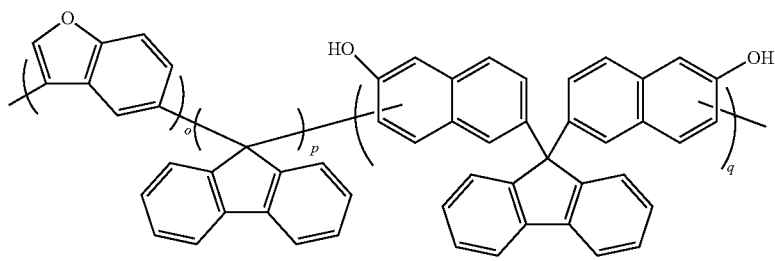
[Chemical Formula 2-26]
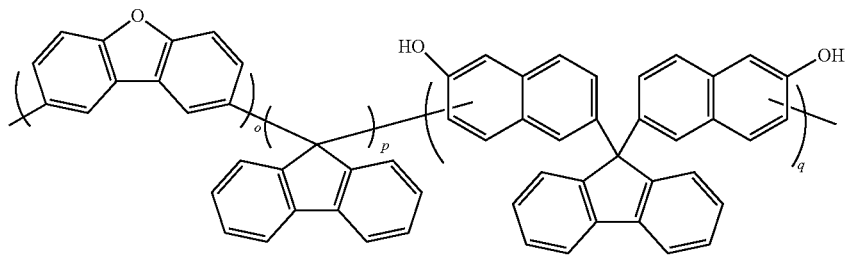
[Chemical Formula 2-27]
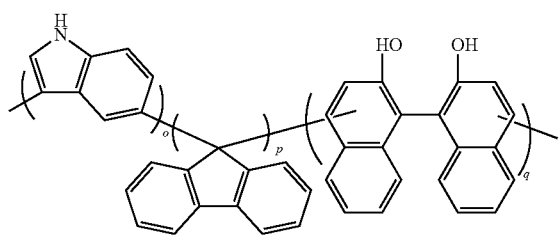
[Chemical Formula 2-28]
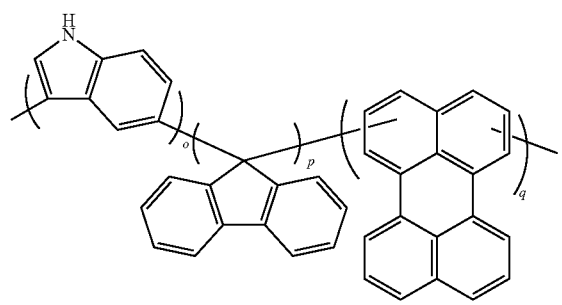

-continued

[Chemical Formula 2-29]

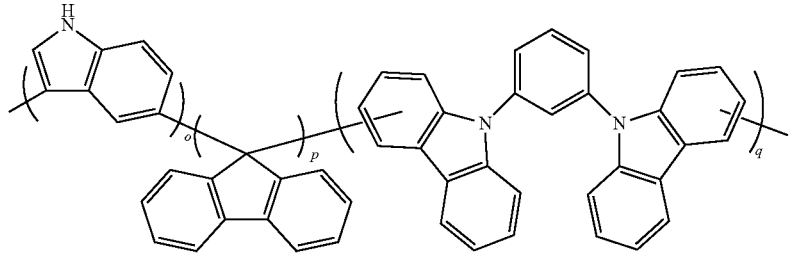

[Chemical Formula 2-30]

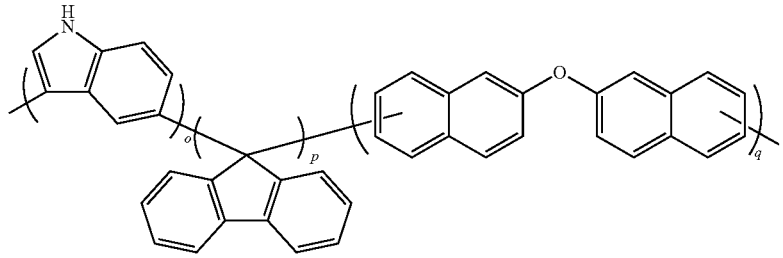

[Chemical Formula 2-31]

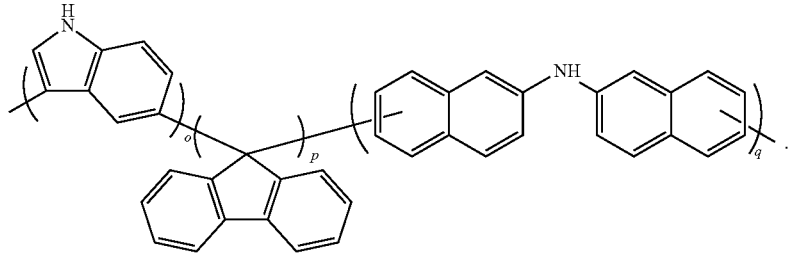

6. An anti-reflective hard mask composition comprising:
   (a) a polymer including the terpolymer according to any one of claim 1, or a blend of the polymer; and
   (b) an organic solvent.

7. The anti-reflective hard mask composition of claim 6, further comprising:
   a crosslinking agent and an acid catalyst.

8. The anti-reflective hard mask composition of claim 7, wherein the hard mask composition is formed of a total of 100% by weight using:
   (a) 1 to 30% by weight of the polymer including the terpolymer of Chemical Formula 1, or the blend of the polymer;
   (b) 0.1 to 5% by weight of the crosslinking agent;
   (c) 0.001 to 0.05% by weight of the acid catalyst; and
   (d) the organic solvent as a remaining component.

9. The anti-reflective hard mask composition of claim 7, wherein the crosslinking agent is any one selected from the group consisting of compounds of methoxymethylated glycoluril, butoxymethylglycoluril, methoxymethylated melamine, butoxymethylated melamine, methoxymethylated benzoguanamine, butoxymethylated benzoguanamine, methoxymethylation urea, butoxymethylation urea, and methoxymethylation thiourea.

10. The anti-reflective hard mask composition of claim 7, wherein the acid catalyst is any one selected from the group consisting of p-toluenesulfonic acid monohydrate, pyridinium P-toluene sulfonate, 2,4,4,6-tetrabromocyclohexadienone, benzoin tosylate, 2-nitrobenzyl tosylate, and alkyl esters of organic sulfonic acid.

* * * * *